United States Patent
Burdeaux et al.

(10) Patent No.: US 7,592,673 B2
(45) Date of Patent: Sep. 22, 2009

(54) ESD PROTECTION CIRCUIT WITH ISOLATED DIODE ELEMENT AND METHOD THEREOF

(75) Inventors: David C. Burdeaux, Phoenix, AZ (US); Daniel J. Lamey, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 138 days.

(21) Appl. No.: 11/692,722

(22) Filed: Mar. 28, 2007

(65) Prior Publication Data

US 2007/0228475 A1    Oct. 4, 2007

(51) Int. Cl.
*H01L 23/62* (2006.01)

(52) U.S. Cl. .............................. 257/355; 257/E27.112; 438/237; 361/111

(58) Field of Classification Search .................. 257/355, 257/356, 357, E27.112; 361/111; 438/237
See application file for complete search history.

(56) References Cited

U.S. PATENT DOCUMENTS

| | | | |
|---|---|---|---|
| 5,243,234 A | | 9/1993 | Lin et al. |
| 5,578,860 A | * | 11/1996 | Costa et al. .................. 257/528 |
| 6,015,992 A | * | 1/2000 | Chatterjee et al. ........... 257/350 |
| 6,060,752 A | | 5/2000 | Williams |
| 6,064,249 A | * | 5/2000 | Duvvury et al. .............. 327/314 |
| 6,222,236 B1 | | 4/2001 | Lamey |
| 6,229,180 B1 | * | 5/2001 | Yoshida et al. .............. 257/355 |
| 6,670,834 B1 | | 12/2003 | Swanson |
| 6,674,129 B1 | | 1/2004 | Colclaser et al. |
| 2005/0110060 A1 | | 5/2005 | Shiu et al. |

OTHER PUBLICATIONS

PCT/2006EP/004038 filed on Mar. 31, 2006.

* cited by examiner

*Primary Examiner*—Lex Malsawma
*Assistant Examiner*—Robert Huber
(74) *Attorney, Agent, or Firm*—Michael J. Balconi-Lamica

(57) ABSTRACT

An ESD protection circuit (20) includes an ESD device (24) and an isolation diode element (30). The ESD device includes a drain-source junction isolated ESD transistor (26,28). The isolation diode element is coupled in series with the ESD device and configured for providing ESD protection to a transistor device (22) needing ESD protection. Responsive to −Vgs conditions on a gate of the protected transistor device, the series coupled isolation diode element prevents a forward biasing of the drain-source junction of the ESD transistor prior to a breakdown condition of the isolation diode element. In addition, responsive to an ESD event sufficient to cause damage to the protected transistor device, the series coupled isolation diode element permits an occurrence of the breakdown condition. Furthermore, the ESD protection circuit can operate in both (i) a polarity of normal operation of the protected device and (ii) an opposite polarity other than in normal operation of the protected device.

14 Claims, 5 Drawing Sheets

ESD PROTECTION CIRCUIT WITH ISOLATED DIODE ELEMENT AND METHOD THEREOF

BACKGROUND

The present disclosures relate to electrostatic discharge protection, and more particularly, to an ESD protection circuit with an isolated diode element and method thereof.

Electrostatic Discharge (ESD) events are high electrical potentials with limited energy that can damage the gate oxides of Field Effect Transistors (FET), by forcing currents to flow through the oxides resulting in a weakened oxide, or reaching sufficient potential to rupture the oxide resulting in a gate short (low resistance path) to another device terminal. ESD events can be caused by human body or machines such as wafer saw.

An ESD protection circuit is comprised of a positive turn-on voltage clamp and a negative turn-on voltage clamp. The positive turn-on voltage clamp design should take into consideration the voltage swing of the signal. It must be designed to sink ESD current at a preset voltage. In most ESD protection circuits, while the design of the positive turn-on voltage clamp requires great attention, the negative turn-on voltage clamp is only designed to sink ESD current at any voltage before device breakdown. Typically, the negative turn-on voltage clamp simply uses a forward diode.

Among various RF circuits, power amplifiers have stringent requirements in both ESD protection and RF performance. In addition, a problem in the art exists with junction isolated ESD circuits in that a junction isolated ESD circuit is subject to 'turn on' when the circuit experiences bias conditions of opposite polarity from its intended normal operating conditions. For radio frequency (RF) field-effect transistors (FETs), such a condition can occur on the gates of the RF FETs (relative to the body) depending upon the drive levels and the class of operation. When the ESD circuit turns on, it can interact with the input signal and bias circuitry, resulting in distortion of the input signal and poor RF performance.

Prior solutions include use of diodes for ESD circuits that are generally fabricated in the single crystal portion of the semiconductor substrate. In addition, isolation provided and used by such diodes is not intended to resolve issue of opposite bias polarity. Furthermore, isolated poly diodes have been used as fuses for programmable cross point arrays, such as in U.S. Pat. No. 6,670,824 B2. Isolated poly diodes have also been used for input drive protection, as disclosed in U.S. Pat. No. 5,139,959A. However, isolated poly diodes have not been known to be related to an ESD circuit element to address the problems as discussed herein.

FIG. 1 is a schematic representation view 10 of a standard ESD circuit and protected device, as is known in the art. Problems occur with respect to conduction of standard grounded gate n-type Laterally Diffused Metal Oxide Semiconductor (LDMOS) ggNMOSFET ESD circuits during −Vgs conditions (i.e., negative Vgs voltage conditions). The ESD circuit 14 is formed with a common source with the protected device 12. During operation, a −Vgs on the gate of the main FET 12 is a −Vds on the ggNMOSFET ESD circuit 14 and undesirably forward biases the drain-source junction of ESD circuit 14. Protected device 12 includes, for example, an RF LDMOS FET or other transistor device. For an RF amplifier application, the input can include, for example, a DC bias coupled with an RF signal on top of the DC bias.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

According to one embodiment of the present disclosure, an isolated diode (i.e., isolated from the body of the semiconductor) is used in series with an ESD circuit so that the isolated diode is reverse biased when the normal ESD circuit junction isolation would be forward biased. In this way, the combined ESD circuit and isolated diode element do not conduct in response to the input of the protected device RF FET gate being driven into the opposite polarity with respect to the body of the FET.

The embodiments of the present disclosure resolve the problems described above in a novel way, in that, the isolated diode is reversed biased and will not allow conduction through the ESD circuit which would otherwise (i.e., without the series isolated diode) be forward biased and turned on. In one embodiment, the isolated diode comprises an isolated poly silicon diode.

Figure 1:
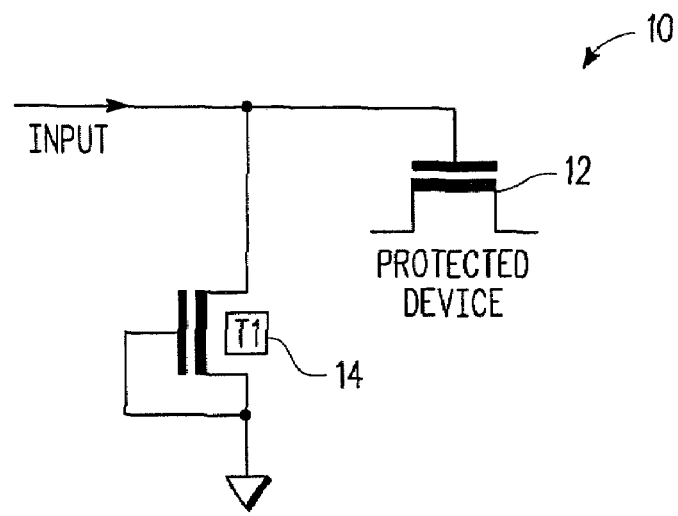
FIG. 1 is a schematic block diagram view of a standard ESD circuit known in the art.
Figure 2:
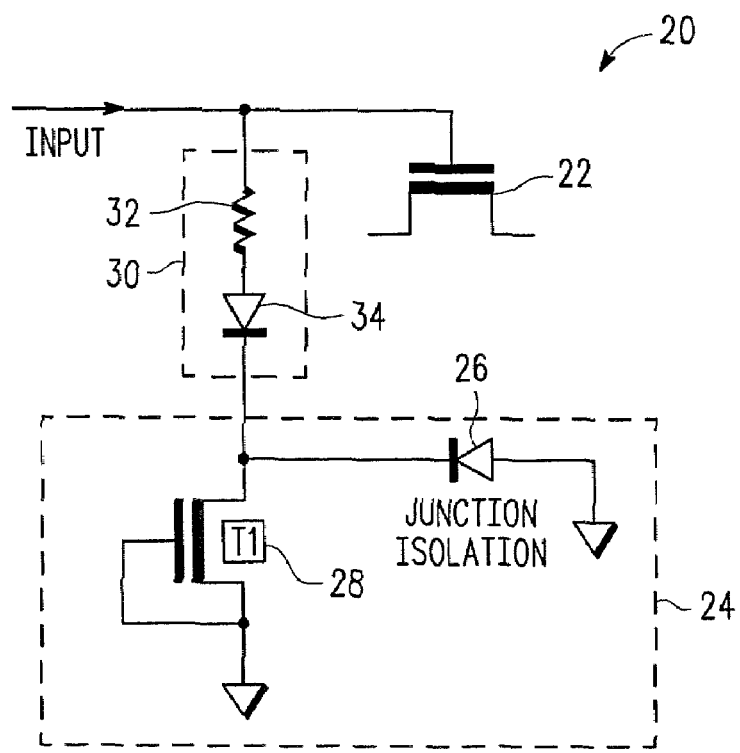
FIG. 2 is a schematic block diagram view of an ESD protection circuit with an isolated diode element according to an embodiment of the present disclosure.

FIG. 2 is a schematic block diagram view of an ESD protection circuit 20 with an isolated diode element according to one embodiment of the present disclosure. The ESD protection circuit 20 includes an ESD device 24 and isolated diode element 30 configured for providing ESD protection to device 22 (hereinafter referred to as the protected device) integrated on a semiconductor chip. In particular, isolated diode element 30 is coupled in series with ESD device 24. Protected device 22 can comprise, for example, an RF LDMOS FET or any other transistor device (RF or non-RF)

needing ESD protection. The ESD circuit 20 is formed with a common source with the protected device 22.

ESD device 24 includes an ESD transistor 28 and junction isolation diode 26. ESD transistor 28 comprises any suitable device for performing an ESD function. For example, ESD transistor 28 can comprise a ggNMOSFET device. Junction isolation diode 26 is a reverse diode, coupled to between the drain of ESD transistor 28 and ground potential (or Vss). In other words, diode 26 provides junction isolation of the drain side of ggNMOSFET device 28, providing junction isolation from the main body of the integrated circuit, i.e., from the entire circuit which the ESD device is on. ESD transistor 28 and junction isolation diode 26 together form a standard ggNMOSFET circuit.

Isolated diode element 30 is illustrated schematically as including a resistive element portion, indicated by reference numeral 32, in series with a diode element portion, indicated by reference numeral 34. The resistive element portion 32 and the diode element portion 34 are not separate elements, but rather, inherent characteristics of the isolated diode element 30. Resistive element portion 32 is representative of the resistance of the isolated diode element 30 as a whole. The amount of resistance of the resistive element portion 32 of isolated diode element 30 is relevant to the performance of the ESD circuit 20. Accordingly, the amount of resistance of the resistive element portion is determined according to a desired performance of the ESD protection circuit 20, the desired performance including, for example, a given breakdown condition of the isolated diode element. In addition, while illustrated as having only a resistive element portion 32 and a diode element portion 34, isolated diode element 30 may also include additional element portions (not shown) in series or parallel with the element portions thereof. In addition, isolated diode element 30 is isolated from the body of the semiconductor of the integrated circuit chip, as will be discussed further herein.

During operation, a −Vgs condition on the gate of the protected device 22 is a −Vds condition on the series connected isolation diode element 30 and ESD device 24; however, the series connected isolation diode element 30 prevents an undesirable forward biasing of the drain-source junction of ESD transistor 28 of ESD device 24 until the isolated diode element 30 reaches a breakdown condition. Accordingly, the corresponding breakdown condition of the isolated diode element 30 is tailored or configured so that −Vgs conditions on the gate of the protected device 22 do not cause the isolated diode element breakdown; however, ESD events that could damage the protected device 22 do cause the isolated diode element breakdown to occur. For an RF amplifier application, the signal input to the protected device 22 can include, for example, a DC bias coupled with an RF signal on top of the DC bias.

FIGS. 3-6 are cross-sectional views of a portion 40 of the ESD protection circuit 20 with an isolated diode element 30 during a manufacture thereof according to an embodiment of the present disclosure.

Figure 3:
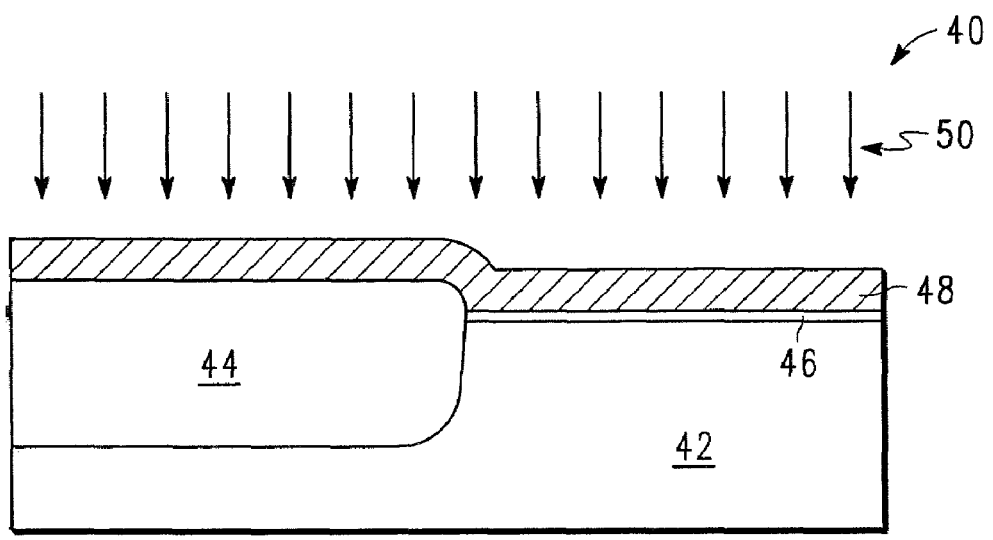
FIGS. 3-6 are cross-sectional views of a portion of the ESD protection circuit with an isolated diode element during a manufacture thereof according to an embodiment of the present disclosure.

Referring now to FIG. 3, a semiconductor substrate 42 is initially provided. Semiconductor substrate 42 comprises any suitable substrate for a given integrated circuit application requiring ESD protection. For example, semiconductor substrate 42 can include silicon, germanium, silicon germanium, a III-V semiconductor material such as gallium arsenide or gallium nitride, or other semiconductor substrate. In addition, semiconductor substrate 42 can include a bulk substrate or a semiconductor-on-insulator (SOI) substrate. In one embodiment, semiconductor substrate 42 comprises a silicon substrate.

An isolation region 44 is provided within semiconductor substrate 42, using any suitable method for forming an isolation region. Isolation region 44 is provided in a location on the semiconductor substrate 42 proximate a region of the protected device (yet to be formed). In addition, isolation region 44 comprises any suitable isolation region according to the requirements of a given integrated circuit with ESD protection. In one embodiment, isolation region 44 comprises a silicon oxide. A gate dielectric 46 is provided overlying semiconductor substrate 42, using any suitable techniques. Gate dielectric 46 comprises any suitable gate dielectric, or gate dielectric stack, according to the requirements of a given integrated circuit with ESD protection. In one embodiment, gate dielectric 46 comprises a silicon oxide.

A semiconductor material 48 is provided, at a minimum, overlying the isolation region 44 and gate dielectric 46, using any suitable method for forming semiconductor material 48. Semiconductor material 48 comprises any suitable semiconductor material for a given integrated circuit application requiring ESD protection. For example, semiconductor material 48 can include poly silicon. Semiconductor material 48 could also include, for example, poly or single crystalline silicon, germanium, silicon-germanium, gallium-arsenide, or gallium-nitride, or any other semi-conducting material.

In FIG. 3, a first implant is performed, as generally indicated by reference numeral 50, using any suitable implant technique. In particular, the first implant includes a blanket implant for providing a desired level of background dopant concentration within the semiconductor material 48. Semiconductor material 48 will be used in the formation of an isolated diode element 68, as will be discussed further herein. In one embodiment, the first implant comprises a lightly doped (i.e., low dose) n-type implant. In another embodiment, the background doping is obtained via a process of depositing semiconductor material 48 with the desired background doping included or incorporated into the layer during deposition of the same using suitable in-situ doping techniques.

Figure 4:
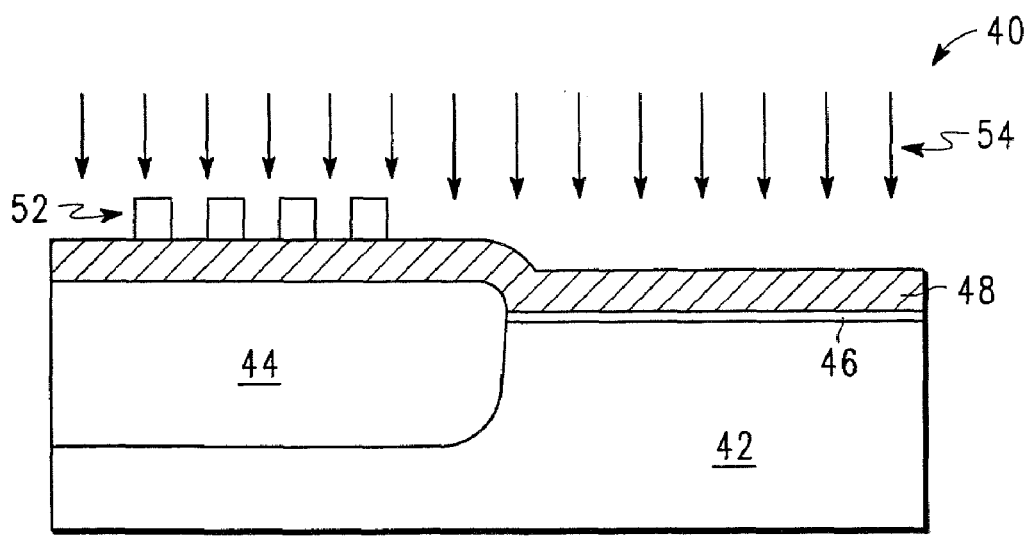

In FIG. 4, a patterned photoresist mask 52 is provided, using any suitable patterning technique. The patterned photoresist mask 52 blocks desired regions of the semiconductor material 48 from receiving a second implant. As shown in FIG. 4, patterned photoresist mask 52 includes four blocked regions. The blocked regions correspond to p-type regions of the isolation diode element 68, yet to be formed. The second implant is then performed, as generally indicated by reference numeral 54. The second implant includes, for example, a heavily doped implant, wherein p-type diode regions are protected from the second implant via the mask pattern 52.

Figure 5:
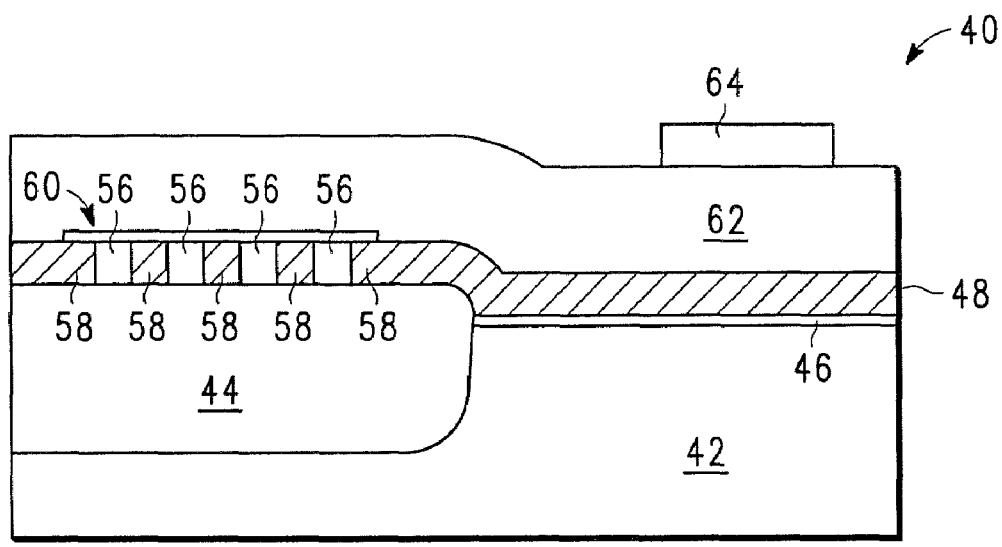

As illustrated in FIG. 5, regions indicated by reference numeral 56 correspond to p-type regions of the isolated diode element to be formed. In addition, regions indicated by the reference numeral 58 correspond to n-type regions of the isolated diode element to be formed. In addition, a patterned hard mask 60 is formed overlying the region of the isolation diode element (yet to be formed), using any suitable formation and patterning technique. In one embodiment, patterned hard mask 60 comprises a nitride hard mask. Subsequent to formation of the hard mask 60, a further gate electrode material 62 is provided, overlying the hard mask 60 and regions of semiconductor material 48 not covered by hard mask 60. In one embodiment, gate electrode material 62 and semiconductor material 48 comprise any suitable materials, that in combination, together are used in the formation of a desired gate electrode stack. For example, in one embodiment, semiconductor material 48 could comprise poly silicon and gate electrode material 62 could comprise tungsten silicide (WSi).

Other gate electrode material stacks are also possible. A patterned gate electrode mask 64 is provided subsequent to formation of the further gate electrode material 62.

Figure 6:
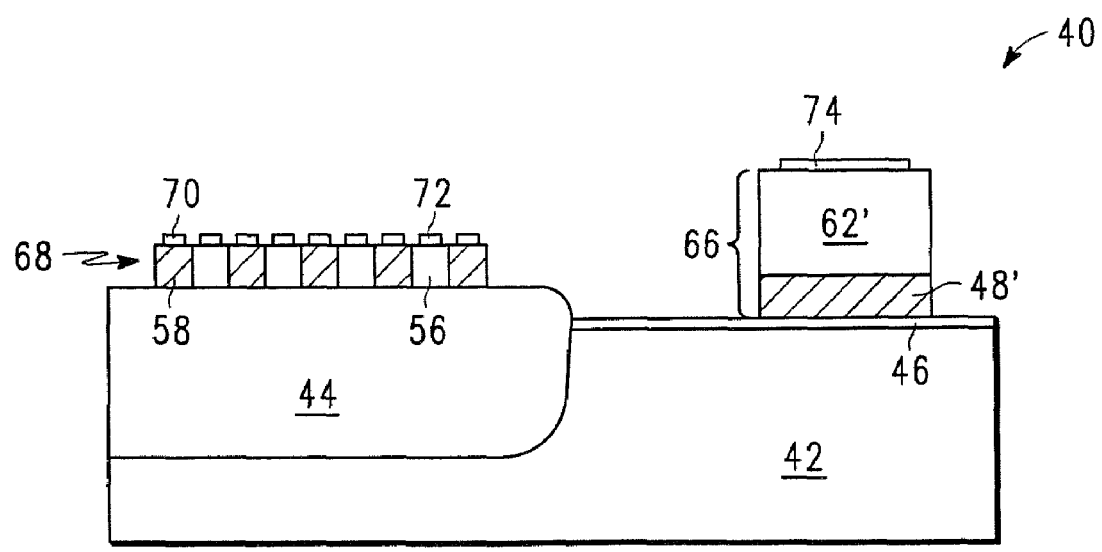

A suitable etching process is then performed for patterning of the gate electrode, generally indicated by reference numeral 66 in FIG. 6. The gate electrode 66 includes a remaining portion of semiconductor material 48' and material 62'. Etching through material 62 and material 48 also patterns the isolated diode element 68, as defined by the overlying hard mask 60 of FIG. 5.

In FIG. 6, the diode element 68 is isolated. In one embodiment, the isolated diode 68 comprises an isolated poly silicon diode. In addition, p-type implants are performed to counter dope appropriate regions through a remaining nitride hardmask (not shown), for p-type poly diode contacts. Metalizations are formed overlying respective areas (56,58) of the isolation diode 68 and the gate electrode 66. In particular, metallization indicated by reference numeral 70 corresponds to the n-type regions 58 of the isolation diode element 68. Metallization indicated by reference numeral 72 corresponds to the p-type regions 56 of the isolation diode element 68. Lastly, metallization indicated by reference numeral 74 corresponds to the gate electrode 66.

Note that while FIG. 6 is representative of one embodiment, other embodiments of the present disclosure are also possible. For example, the isolated diode element 68 of FIG. 6 has been described as having p-type regions surrounded by n-type regions. In another embodiment, the regions (56,58) of the isolated diode element can comprise n-type regions surrounded by p-type regions. In addition, another embodiment can include uniform pairs of n-type and p-type regions to form the isolated diode element. Furthermore, the implant dopant levels, quantity, and pairing of n-type and/or p-type regions, corresponding to the resistive element portion of the isolation diode element as discussed with respect to FIGS. 2-6, are selected to provide a desired characteristic resistance, corresponding to a desired isolation diode breakdown condition, for the requirements of a given ESD protection circuit implementation.

Figure 7:
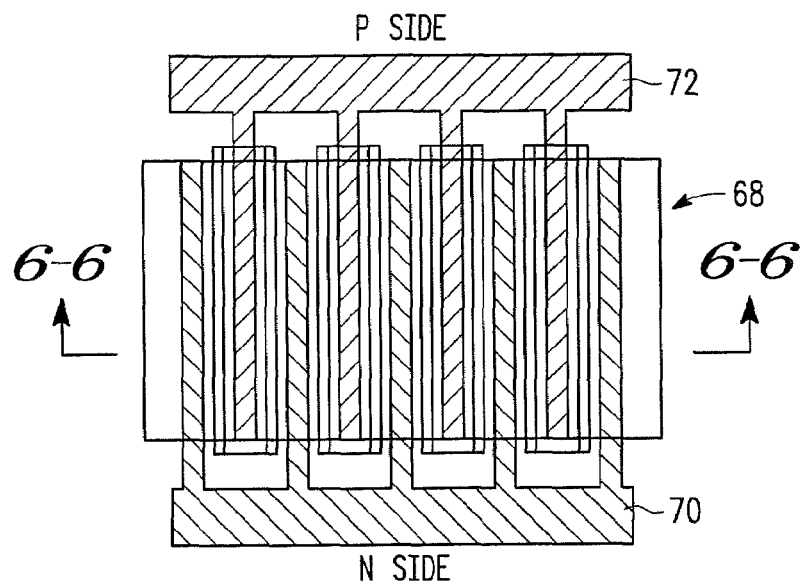
FIG. 7 is a top-down view of a portion of the ESD protection circuit with an isolated diode element according to one embodiment of the present disclosure.

FIG. 7 is a top-down view of a portion of the ESD protection circuit with an isolated diode element 68 according to one embodiment of the present disclosure. The cross-section of isolated diode element 68 is indicated by the line 6-6 of FIG. 7. The top-down view illustrates an interdigitated isolated diode element, wherein reference numeral 70 identifies the n-type interdigitated side metallization of the isolated diode element and reference numeral 72 identifies the p-type interdigitated side metallization of the isolated diode element 68.

Figure 8:
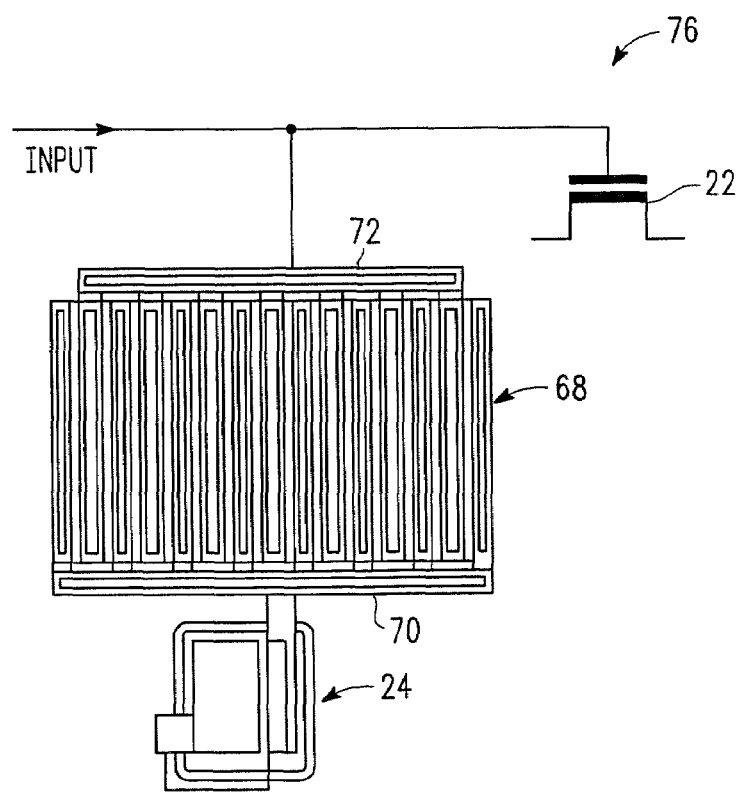
FIG. 8 is an image view of a portion of the ESD protection circuit with an isolated diode element according to one embodiment of the present disclosure.

FIG. 8 is an image view 76 of a portion of the ESD protection circuit with an isolated diode element according to one embodiment of the present disclosure. The view in FIG. 8 includes a photo image of the interdigitated metallization of the isolated diode element 68 in series with ESD device 24. Also illustrated schematically are the input and the protected device 22.

Figure 9:
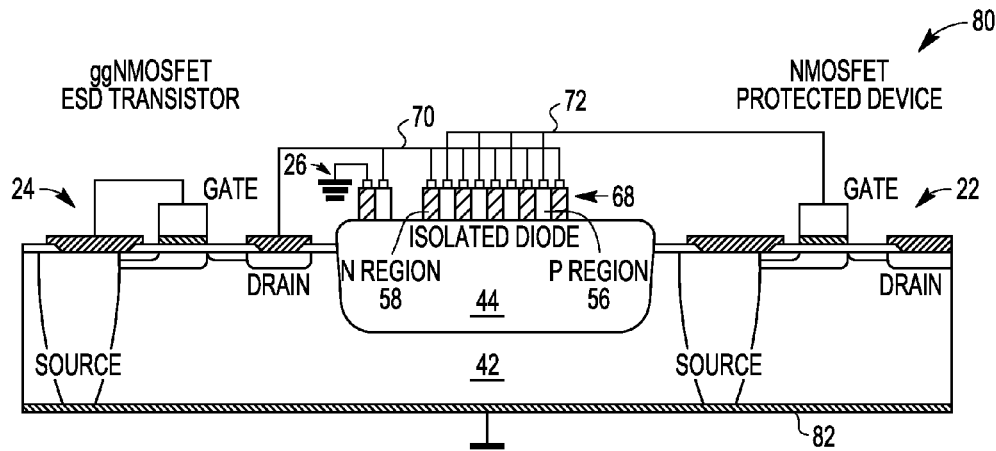
FIG. 9 is a cross-sectional view of an ESD protection circuit with an isolated diode element according to one embodiment of the present disclosure.

FIG. 9 is a cross-sectional view 80 of an ESD protection circuit with an isolated diode element according to one embodiment of the present disclosure. FIG. 9 further illustrates a cross-sectional view of an example of a ggNMOSFET ESD transistor of ESD device 24 and an NMOSFET protected device 22. Layer 82 is an electrical contacting layer (for example, a metal contact) to allow electrical access to the shorted source/body of the protected device 22 and to the ESD circuit 24. For example, the source implants of the respective devices sufficiently extend into the semiconductor substrate 42 so as to contact layer 82.

Figure 10:
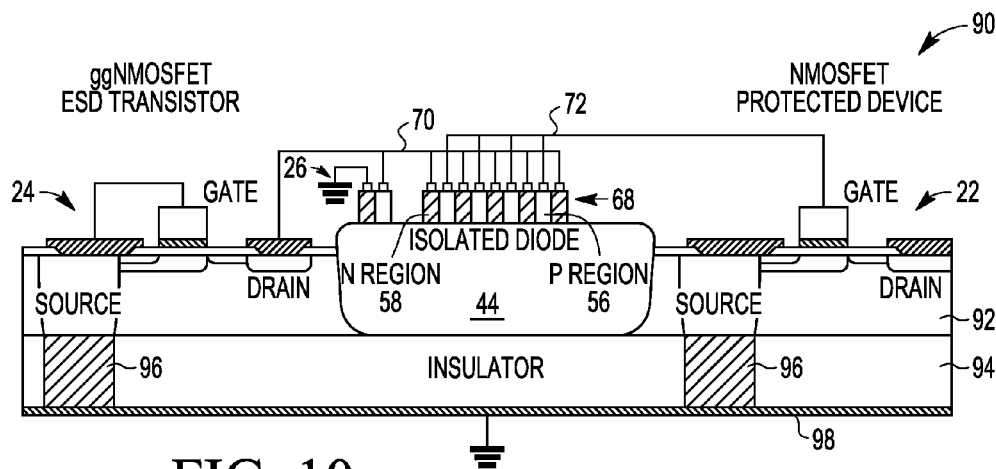
FIG. 10 is a cross-sectional view of an ESD protection circuit with an isolated diode element according to another embodiment of the present disclosure.

FIG. 10 is a cross-sectional view 90 of an ESD protection circuit with an isolated diode element according to another embodiment of the present disclosure. In the embodiment of FIG. 10, the starting substrate comprises a semiconductor-on-insulator substrate. Except for the starting substrate, the formation of the isolation diode element is generally similar to that as described with respect to FIGS. 3-6. FIG. 10 further illustrates a cross-sectional view of an example of a ggNMOSFET ESD transistor of ESD device 24 and an NMOSFET protected device 22.

In particular, layer 92 is similar to layer 42 of FIG. 9. Layer 94 constitutes an electrically insulating layer of an SOI substrate for isolating the back side of the substrate from the source/body of the illustrated devices 22 and 24. Regions 96 represent electrical contacts made through insulator layer 94 to allow electrical contact to the source/body of the illustrated devices 22 and 24. In addition, layer 98 is similar to layer 82 of FIG. 9.

Figure 11:
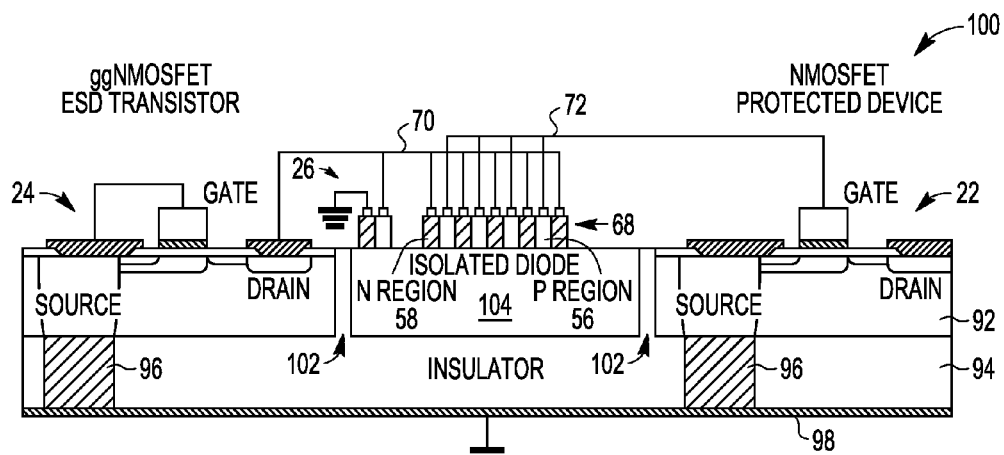
FIG. 11 is a cross-sectional view of an ESD protection circuit with an isolated diode element according to yet another embodiment of the present disclosure.

FIG. 11 is a cross-sectional view 100 of an ESD protection circuit with an isolated diode element according to yet another embodiment of the present disclosure. In the embodiment of FIG. 11, the starting substrate comprises a semiconductor-on-insulator substrate. The formation of the isolation diode element is similar to that as described with respect to FIGS. 3-6, with a few differences. FIG. 11 further illustrates a cross-sectional view of an example of a ggNMOSFET ESD transistor of ESD device 24 and an NMOSFET protected device 22.

In particular, regions 102 comprise insulating regions, such as a trench isolation, refilled with silicon oxide or other suitable isolation material. Insulating regions 102 electrically isolate a portion of the single or poly crystalline material of the starting semiconducting substrate layer 92, wherein the isolated portion of substrate layer 92 is identified by reference numeral 104. Unlike devices 22 and 24 which have electrical contacts 96 made to a back side electrical contact layer 98, portion 104 remains electrically isolated. As a result, the isolated diode element 68 can be formed within the isolated portion 104 of semiconductor material in a manner similar to that described herein above with respect to the other embodiments. In addition, the isolated diode element 68 can be formed with alternating p-type and n-type regions, wherein the alternating p-type and n-type regions are tailored for a desired isolated diode performance for ESD protection of the protected device 22, appropriate for a given semiconductor device application.

According to one embodiment of the present disclosure, the ESD protection circuit with an isolation diode element has been designed for Laterally Diffused Metal Oxide Semiconductor (LDMOS) power amplifier applications; however, it can also be used for other RF circuits and/or any other transistor devices needing ESD protection. In addition, the embodiments of the present disclosure include an isolated diode having an avalanche breakdown set at a level to provide a normal operation region, while still providing protection of a desired main FET gate oxide from damaging potentials. Furthermore, the interdigitated design is configured to provide low forward and reverse (avalanche) resistance. Moreover, the embodiments of the present disclosure provide for operation under both positive and negative polarity across the protected device, and in particular, on an input side of the protected device. Still further, the ESD protection circuit can operate in a polarity other than that in normal operation of the protected device. While the examples discussed herein have included n-channel enhancement mode devices (thus −Vgs is not that of normal operation), it is noted that for either a p-channel enhancement mode device or a depletion mode device, the −Vgs condition may be the normal condition. Accordingly, different device designs may require opposite polarity requirements.

In the foregoing specification, the disclosure has been described with references to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes an ESD circuit element to support RF-LDMOS devices, but it could also be applicable anywhere ESD protection is required where a switch in bias polarity is experienced. In addition, the isolated diode fabricated in conjunction with the ESD transistor device as discussed herein advantageously enables an expanded operating range for a protected device. Furthermore, the embodiments address −Vgs swings, provide more dynamic range, less parasitics, and generally consumes less silicon area.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An ESD protection circuit comprising:
an ESD device, wherein the ESD device includes a source, a gate and a drain;
a junction isolation diode coupled between the drain of the ESD device and a ground potential for providing junction isolation of the drain; and
an isolation diode element coupled in series with the ESD device and configured for providing ESD protection to a transistor device needing ESD protection having a source, a gate and a drain, wherein (i) responsive to −Vgs conditions on a gate of the protected transistor device, the series coupled isolation diode element prevents a forward biasing of the drain-source junction of the ESD transistor prior to a breakdown condition of the isolation diode element, (ii) responsive to an ESD event sufficient to cause damage to the transistor device needing ESD protection, the series coupled isolation diode element permits an occurrence of the breakdown condition, further wherein the ESD protection circuit can operate in both (i) a polarity of normal operation of the protected device and (ii) an opposite polarity other than in normal operation of the transistor device needing ESD protection; and (iii) the source of the transistor device needing ESD protection is connected to the source of the ESD device by a back side of a substrate of the ESD protection circuit, the substrate comprising an SOI substrate and an isolation region that is bounded by (i) trench isolation and (ii) an insulator layer of the SOI substrate, the isolation diode element comprising a diode element isolated from the substrate by the isolation region in the substrate between the ESD device and the transistor device needing ESD protection.

2. The circuit of claim 1, wherein the isolation region comprises silicon oxide.

3. The circuit of claim 1, wherein the isolation diode element comprises interdigitated n-type and p-type regions.

4. The circuit of claim 1, wherein the isolation diode element includes a semiconductor material selected from the group consisting of single crystalline silicon, poly crystalline silicon, germanium, silicon-germanium, gallium-arsenide, and gallium-nitride.

5. The circuit of claim 1, wherein the isolation diode element comprises one selected from the group consisting of (i) p-type regions surrounded by n-type regions, (ii) n-type regions surrounded by p-type regions, and (iii) uniform pairs of n-type and p-type regions.

6. The circuit of claim 1, further wherein the series coupled isolation diode element and ESD device do not conduct in response to an input to the protected device gate being driven into an opposite polarity with respect to a polarity of the substrate of the ESD protection circuit.

7. The circuit of claim 1, wherein the isolation diode element comprises a resistive element portion and a diode element portion, wherein an amount of resistance of the resistive element portion establishes a given breakdown condition of the isolated diode element.

8. The circuit of claim 1, wherein the back side of the substrate of the ESD protection circuit is connected to ground.

9. The circuit of claim 1, wherein the isolation diode element comprises an isolated poly silicon diode element.

10. The circuit of claim 1, wherein the isolated diode element is located proximate the transistor device needing ESD protection.

11. The circuit of claim 1, wherein the transistor device needing ESD protection comprises an RF LDMOSFET.

12. The circuit of claim 1, wherein the ESD device comprises a grounded-gate n-type Laterally Diffused Metal Oxide Semiconductor ESD circuit.

13. A method of making an ESD protection circuit comprising:
forming an ESD device, the ESD device including a source, a drain and a gate;
forming a junction isolation diode and coupling the junction isolation diode between the drain of the ESD device and a ground potential for providing junction isolation of the drain of the ESD device;
forming an isolation diode element coupled in series with the ESD device by forming a diode element isolated from the ESD protection circuit, wherein the isolation diode element is configured for providing ESD protection to a transistor device needing ESD protection, wherein (i) responsive to −Vgs conditions on a gate of the transistor device needing ESD protection, the series coupled isolation diode element prevents a forward biasing of the drain-source junction of the ESD transistor prior to a breakdown condition of the isolation diode element, and (ii) responsive to an ESD event sufficient to cause damage to the transistor device needing protection, the series coupled isolation diode element permits an occurrence of the breakdown condition, further wherein the ESD protection circuit can operate in both (i) a polarity of normal operation of the protected device and (ii) an opposite polarity other than in normal operation of the transistor device needing protection;

connecting the source of the transistor device needing ESD protection to the source of the ESD device by a back side of a substrate of the ESD protection circuit; and forming an isolation region prior to forming the isolation diode element, the isolation region providing isolation between the isolation diode element and the semiconductor substrate, by bounding a portion of semiconductor material by (i) trench isolation and (ii) an insulator layer of an SOI substrate, the isolation diode element being formed within the portion of semiconductor material.

14. The method of claim 13, wherein forming the isolation diode element comprises forming interdigitated n-type and p-type regions.

* * * * *